United States Patent
Cheung et al.

(10) Patent No.: US 7,197,104 B1
(45) Date of Patent: Mar. 27, 2007

(54) MINIMUM GATE DELAY EDGE COUNTER

(75) Inventors: Hung K. Cheung, Fremont, CA (US);
Hee Wong, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 90 days.

(21) Appl. No.: 10/781,560

(22) Filed: Feb. 18, 2004

(51) Int. Cl.
*H03K 23/00* (2006.01)

(52) U.S. Cl. ........................ 377/118; 377/119
(58) Field of Classification Search ............... None
See application file for complete search history.

(56) References Cited

U.S. PATENT DOCUMENTS

| | | | | |
|---|---|---|---|---|
| 5,481,580 A | * | 1/1996 | Guzinski | 377/29 |
| 5,526,391 A | * | 6/1996 | Shankar et al. | 377/47 |
| 5,727,038 A | * | 3/1998 | May et al. | 375/376 |
| 6,026,140 A | * | 2/2000 | Owen | 377/51 |
| 6,760,389 B1 | * | 7/2004 | Mukherjee et al. | 375/326 |
| 6,788,113 B2 | * | 9/2004 | Watanabe et al. | 327/66 |
| 6,795,519 B2 | * | 9/2004 | Chakravarthy | 377/48 |
| 6,861,881 B1 | * | 3/2005 | Neravetla et al. | 327/115 |
| 2004/0165693 A1 | * | 8/2004 | Lee et al. | 377/94 |

* cited by examiner

*Primary Examiner*—Timothy P. Callahan
*Assistant Examiner*—Cassandra Cox

(57) ABSTRACT

An edge counter counting both rising and falling edges of an input signal is implemented with combinational logic, without using flip-flops. The combinational logic is designed using intermediate signals and state transitions producing an output signal having a cycle corresponding to a predetermined odd or even number of input signal edges, with the logic optimized and protected against entry into "stuck" states. A low power, low gate count edge counter is thus implemented with an output signal duty cycle at least as balanced as the input counter duty cycle.

23 Claims, 6 Drawing Sheets

| $x_{n-1}, \ldots, x_2, x_1, x_0$ \ C | 0 | 1 |
|---|---|---|
| Gray code 0 | | |
| Gray code 1 | | |
| Gray code 2 | | |
| Gray code 3 | | |
| ... | | |
| Gray code r | | |
| Gray code r+1 | | |
| ... | | |
| Gray code $2^n-r-2$ | | |
| Gray code $2^n-r-1$ | | |
| ... | | |
| Gray code $2^n-3$ | | |
| Gray code $2^n-2$ | | |
| Gray code $2^n-1$ | | |

FIG. 4A

| $x_{n-1}, \ldots, x_2, x_1, x_0$ \ C | 0 | 1 |
|---|---|---|
| Gray code 0 | Gray code 0 | Gray code 1 |
| Gray code 1 | Gray code 2 | Gray code 1 |
| Gray code 2 | Gray code 2 | Gray code 3 |
| Gray code 3 | Gray code 4 | Gray code 3 |
| ... | ... | ... |
| Gray code r | Gray code r | Gray code $2^n-r-1$ |
| Gray code r+1 | X | X |
| ... | ... | ... |
| Gray code $2^n-r-2$ | X | X |
| Gray code $2^n-r-1$ | Gray code $2^n-r$ | Gray code $2^n-r-1$ |
| ... | ... | ... |
| Gray code $2^n-3$ | Gray code $2^n-2$ | Gray code $2^n-3$ |
| Gray code $2^n-2$ | Gray code $2^n-2$ | Gray code $2^n-1$ |
| Gray code $2^n-1$ | Gray code 0 | Gray code $2^n-1$ |

FIG. 4B

| $x_{n-1}, \ldots, x_2, x_1, x_0$ \ C | 0 | 1 |
|---|---|---|
| Gray code 0 | (Gray code 0) | Gray code 1 |
| Gray code 1 | Gray code 2 | (Gray code 1) |
| Gray code 2 | (Gray code 2) | Gray code 3 |
| Gray code 3 | Gray code 4 | (Gray code 3) |
| ... | ... | ... |
| Gray code r | (Gray code r) | Gray code $2^n-r-1$ |
| Gray code r+1 | X | X |
| ... | ... | ... |
| Gray code $2^n-r-2$ | X | X |
| Gray code $2^n-r-1$ | Gray code $2^n-r$ | (Gray code $2^n-r-1$) |
| ... | ... | ... |
| Gray code $2^n-3$ | Gray code $2^n-2$ | (Gray code $2^n-3$) |
| Gray code $2^n-2$ | (Gray code $2^n-2$) | Gray code $2^n-1$ |
| Gray code $2^n-1$ | Gray code 0 | (Gray code $2^n-1$) |

FIG. 4C

| $x_{n-1}, \ldots, x_2, x_1, x_0$ \ S,C | 00 | 01 | 11 | 10 |
|---|---|---|---|---|
| Gray code 0 | 0 | 0 | X | 1 |
| Gray code 1 | 0 | 0 | 1 | 1 |
| Gray code 2 | 0 | 0 | 1 | 1 |
| Gray code 3 | 0 | 0 | 1 | 1 |
| ... | ... | ... | ... | ... |
| Gray code r | 0 | 0 | 1 | 1 |
| Gray code r+1 | X | 0 | X | 1 |
| ... | ... | ... | ... | ... |
| Gray code $2^n-r-2$ | 0 | 0 | 1 | 1 |
| Gray code $2^n-r-1$ | 0 | 0 | 1 | 1 |
| ... | ... | ... | ... | ... |
| Gray code $2^n-3$ | 0 | 0 | 1 | 1 |
| Gray code $2^n-2$ | 0 | 0 | 1 | 1 |
| Gray code $2^n-1$ | 1 | X | 1 | 1 |

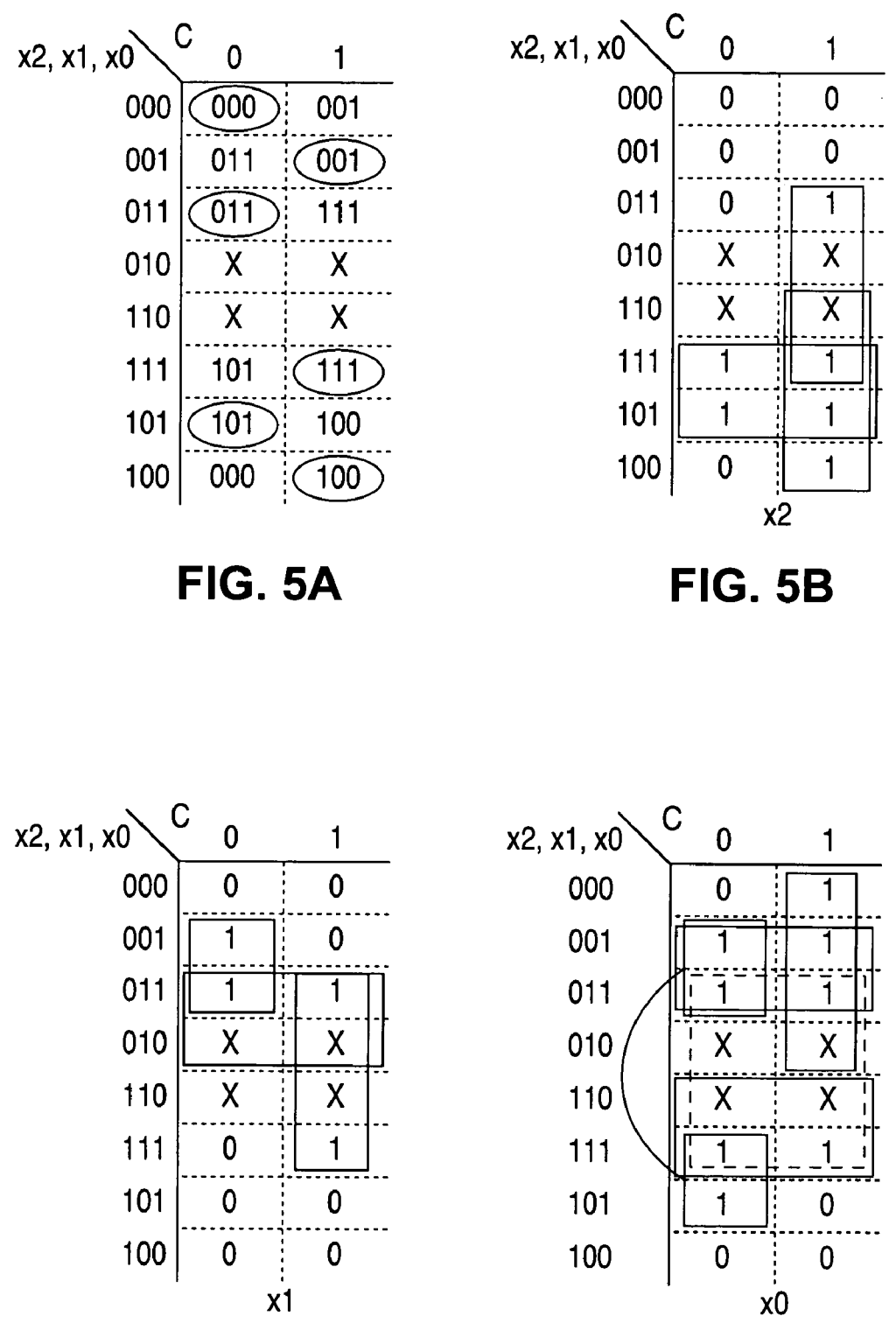

| x2, x1, x0 \ C | 0 | 1 |
|---|---|---|
| 000 | (000) | 001 |
| 001 | 011 | (001) |
| 011 | (011) | 111 |
| 010 | X | X |
| 110 | X | X |
| 111 | 101 | (111) |
| 101 | (101) | 100 |
| 100 | 000 | (100) |

FIG. 5B

| x2, x1, x0 \ C | 0 | 1 |
|---|---|---|
| 000 | 0 | 0 |
| 001 | 0 | 0 |
| 011 | 0 | 1 |
| 010 | X | X |
| 110 | X | X |
| 111 | 1 | 1 |
| 101 | 1 | 1 |
| 100 | 0 | 1 | x2

FIG. 5C

| x2, x1, x0 \ C | 0 | 1 |
|---|---|---|
| 000 | 0 | 0 |
| 001 | 1 | 0 |
| 011 | 1 | 1 |
| 010 | X | X |
| 110 | X | X |
| 111 | 0 | 1 |
| 101 | 0 | 0 |
| 100 | 0 | 0 | x1

FIG. 5D

| x2, x1, x0 \ C | 0 | 1 |
|---|---|---|
| 000 | 0 | 1 |
| 001 | 1 | 1 |
| 011 | 1 | 1 |
| 010 | X | X |
| 110 | X | X |
| 111 | 1 | 1 |
| 101 | 1 | 0 |
| 100 | 0 | 0 | x0

| x2, x1, x0 \ C | 0 | 1 |
|---|---|---|
| 000 | 0 | 0 |
| 001 | 0 | 0 |
| 011 | 0 | 1 |
| 010 | X | X |
| 110 | X | X |
| 111 | 1 | 1 |
| 101 | 1 | 1 |
| 100 | 0 | 1 |

OutClk

US 7,197,104 B1

MINIMUM GATE DELAY EDGE COUNTER

TECHNICAL FIELD OF THE INVENTION

The present invention is directed, in general, to edge counters and, more specifically, to implementing edge counters with minimum gate delay.

BACKGROUND OF THE INVENTION

Conventional counters typically only count one type of edge (rising or falling) of the input signal, and cannot achieve a 50/50 duty cycle output when the divide ratio is odd. Most conventional counter designs, an example of which is depicted in FIG. 6, use flip-flop cells together with combinational feedback logic and have a long latency delay, generally a three-gate delay minimum (where a D flip-flop is considered to incur a two-gate delay). In addition, multiple gate paths, usually resulting from a logical OR function combining two signal paths, result in asymmetrical responses on positive and negative events. Conventional designs also have a high AND/OR logic gate count, with the example in FIGURE X having 27 (six AND/OR gates in each of the four D flip-flop).

There is, therefore, a need in the art for an edge counter with minimal gate delay, and preferably with a single gate path and low logic gate count.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIGS. 4A through 4E illustrate a process for designing an edge counter including combinational logic for minimal gate delay according to one embodiment of the present invention;

FIGS. 5A through 5E illustrate design of the edge counter of FIG. 2 using the process of FIGS. 4A–4E according to one embodiment of the present invention; and FIG. 6 depicts a conventional edge counter design.

DETAILED DESCRIPTION OF THE INVENTION

Figure 1:
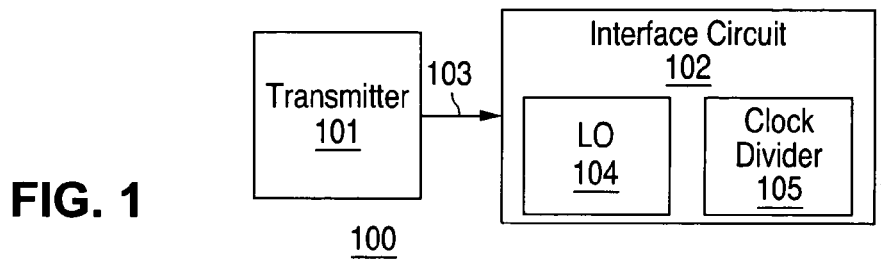
FIG. 1 depicts a communications system employing an edge counter according to one embodiment of the present invention.

To address the above-discussed deficiencies of the prior art, it is a primary object of the present invention to provide, for use in a wireless receiver for a wireless communications system, an edge counter counting both rising and falling edges of an input signal, implemented with combinational logic only and without flip-flops. The combinational logic is designed using intermediate signals and state transitions producing an output signal having a cycle corresponding to a predetermined odd or even number of input signal edges, with the logic optimized and protected against entry into "stuck" states. A low power, low gate count edge counter is thus implemented with an output signal duty cycle at least as balanced as the input counter duty cycle.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the detailed description below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller might be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

FIGS. 1 through 5E, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

FIG. 1 depicts a communications system employing an edge counter according to one embodiment of the present invention. Communications system 100 includes a transmitter 101, a receiver 102 and a communications channel 103 therebetween. Communications system 100 may be, for example, a wireless communications system. Those skilled in the art will recognize that the full construction and operation of a communications system is not depicted or described herein. Instead, for simplicity and clarity, only so much of the construction and operation of a communications system as is unique to the present invention or necessary for an understanding of the present invention is depicted and described.

In the present invention, receiver 102 includes either a low harmonic local oscillator (LO) 104, a low power high frequency divide-by-N clock generator 105, or both. Either the local oscillator 104, the clock divider 105, or both includes an edge counter according to the present invention, as described in further detail below.

Figure 2:
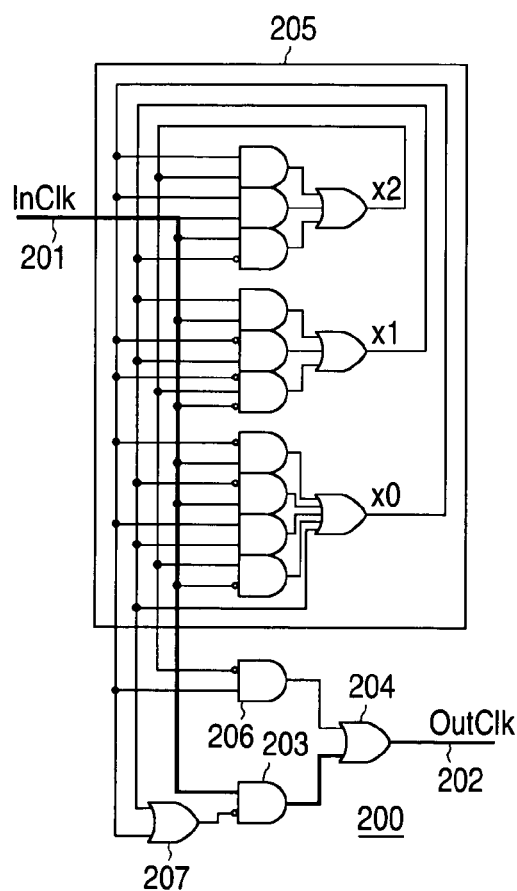
FIG. 2 depicts an edge counter using combinational logic with minimal gate delay according to one embodiment of the present invention.

FIG. 2 depicts an edge counter according to one embodiment of the present invention. Edge counter 200 includes an input 201 for receiving an input clock signal ("InClk") and an output 202 on which is transmitted an output clock signal ("OutClk"). As illustrated by the thick signal line, the path between the input 201 and the output 202 has only a 2-gate delay, through AND gate 203 and OR gate 204 in the exemplary embodiment.

Edge counter 200 further includes combinational logic 205 also receiving the input clock signal and generating intermediate signals logically combined, by AND gates 203 and 206 and OR gates 204 and 207 in the exemplary embodiment, with the input clock signal to generate the appropriate output clock signal state. Combinational logic 205 is designed as described in further detail below.

Figure 3:
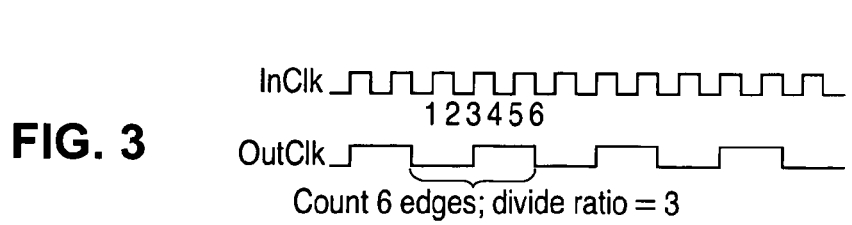
FIG. 3 is a relative timing diagram illustrating input and output clock signals for an edge counter using combinational logic with minimal gate delay according to one embodiment of the present invention.

FIG. 3 is a relative timing diagram illustrating input and output clock signals for an edge counter according to one embodiment of the present invention. In the exemplary embodiment, edge counter 200 is a 6-edge, or a divide-by-3, counter, counting six edges with an output signal having a divide ratio of 3 over the input signal.

Figure 4E:
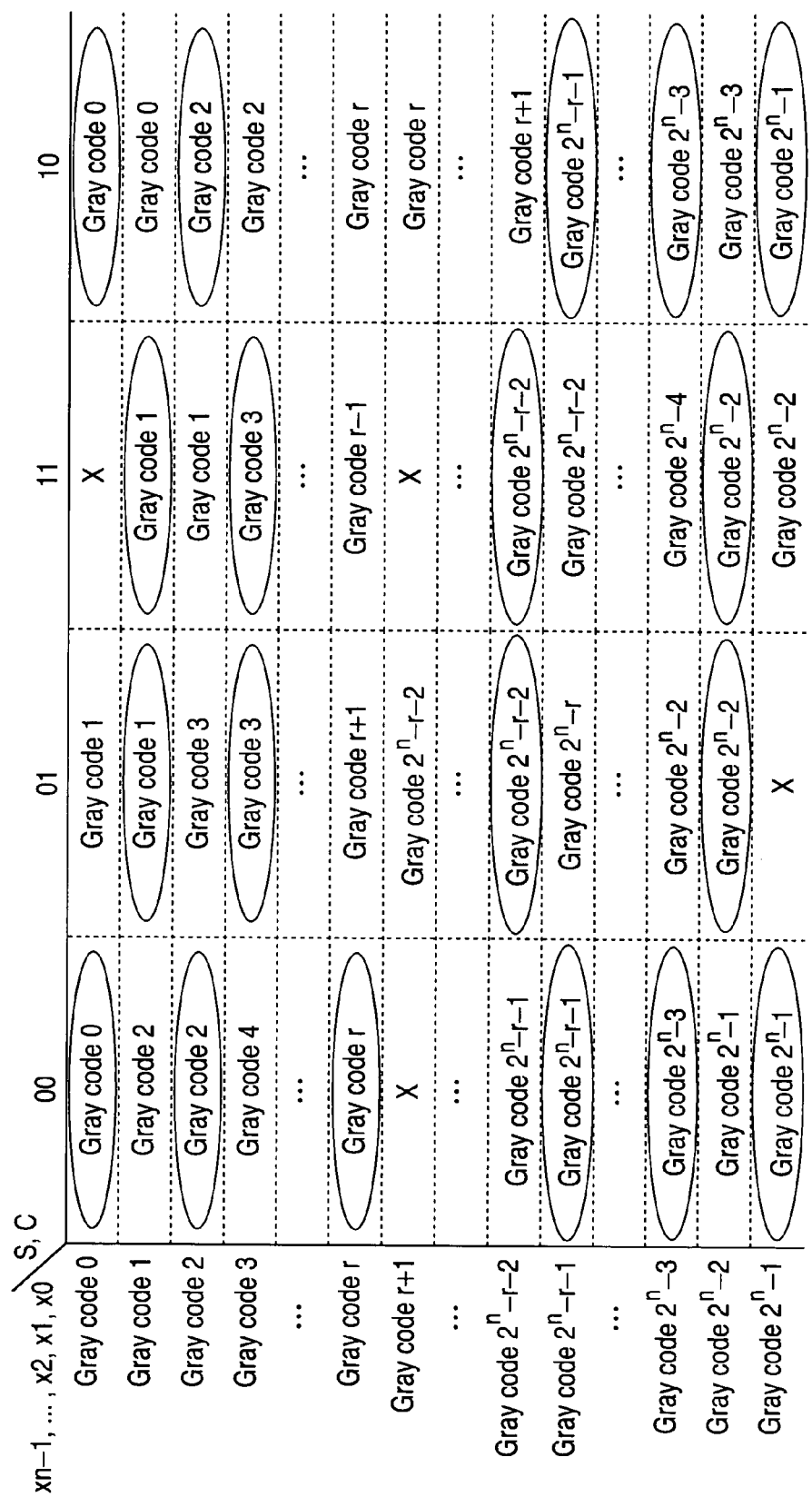

FIGS. 4A through 4E illustrate design a process for designing an edge counter according to one embodiment of the present invention. FIGS. 4A through 4D relate to designing a counter counting an even number of edges, both rising and falling. The process starts with a table having two columns representing the input clock InClk or "C," with a zero at the start of the first column and a one at the start of the second column, as shown in FIG. 4A.

In designing a counter counting m edges, where m is even, n states of the combinational logic and n intermediate signals $x_{n-1}, \ldots, x2, x1$, and $x0$ are defined, where $2^n - 1 \geq m$. In addition, a variable r is defined, where $r = m/2$ when m is an even value. The table thus contains $2^n$ rows, corresponding to gray codes 0 through $2^n - 1$. As normal for gray codes, the gray codes associated with adjacent rows—including the last and first rows—should have only one bit difference. In addition, the gray code associated with row v should be one bit different from the gray code associated with row $2^n - v - 1$, for values of v from 0 to $2^n - 1$.

For an even value of m, starting with the first row, the gray code associated with row 0 is placed in the first column of row 0 (under 0) and the gray code associated with row 1 is placed in the second column of row 0 (under 1). For each subsequent row, the largest-valued gray code from the prior row is placed in the same column as that containing that gray code in the previous row, and the next-higher valued gray code is placed in the other column. The table thus gets filled in a zig-zag fashion as indicated by the arrows in FIG. 4B, corresponding to the state transitions that should result only from changes in the input clock signal. This proceeds until gray code r, at which point the output clock signal should change state. Gray code $2^n - r - 1$ is placed in the last open entry within the row associated with gray code r.

From row r+1 to row $2^n - r - 2$, a "Don't care" (indicated by an X) is placed in each entry. Starting from row $2^n - r - 1$, the gray code associated with row $2^n - r$ is placed in the zero column and the gray code associated with row $2^n - r - 1$ is placed in the one column. The entries are filled in zig-zag fashion as described above and depicted by the arrows in FIG. 4B until the last row, and except for the zero column in the last row (row $2^n - 1$), in which gray code 0 is placed. These entries correspond to the second half of the output clock signal cycle.

Next, each cell containing a gray code value matching the value of the gray code associated with the row including that cell is circled, as depicted in FIG. 4C. These represent states for the counter for which combinational logic is to be designed, with the output clock signal transitioning when the counter moves from one group of states (those in rows 0 to r) to the other (those in rows $2^n - r - 1$ to $2^n - 1$).

Two more columns are then added to the table, with the column title changes to S, C and the column tops changed as shown in FIG. 4D, with the values for adjacent columns differing by one bit. The same procedure described above is used to fill the entries of the two new columns, but proceeding from bottom to top instead of from top to bottom. A Karnaugh map (or "K-map") for the variable S is added, as depicted in FIG. 4D. This state table is then optimized so that n equations may be constructed for the intermediate signals $x_{n-1}, \ldots, x0$.

After optimization, the "Don't care" states in the state table need to be reexamined against the optimization to ensure that the combinational logic cannot become stuck in one of those states after power up. The resulting equations are then employed to construct the n-state edge counter.

Where the divide ratio m is odd, the process is similar except $r = (m-1)/2$ represents the transition boundary for the clock output signal. A state table such as that depicted in FIG. 4E is produced.

Figures 5E, 6:
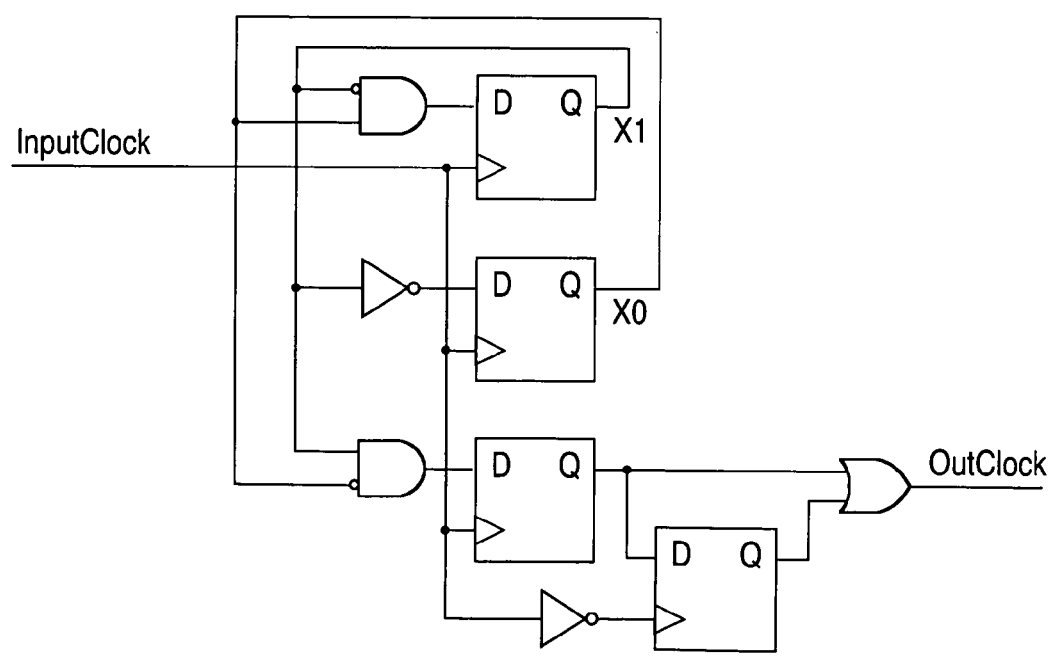

FIGS. 5A through 5E illustrate design of the edge counter of FIG. 2 using the process of FIGS. 4A–4E according to one embodiment of the present invention. FIG. 5A depicts a state table for the 6 edge counter 200, while FIGS. 5B through 5E depict the optimized Karnaugh maps for the signals x2, x1, x0 and OutClk, respectively. The boxes in FIGS. 5B through 5E correspond to the combinational logic depicted in FIG. 2 (including logic and gates 203–207), and the following equations:

$$x2 = (x2 \& x0) | (c \& x2) | (c \& x1)$$

$$x1 = (c \& x1) | (\sim x2 \& x1) | (\sim c \& \sim x2 \& x0)$$

$$x0 = (c \& \sim x2) | (\sim x2 \& x0) | (x2 \& x1) | (\sim c \& x0) | x1$$

$$OutClk = (x2 \& x0) | (c \& x2) | (c \& x1)$$

where the ampersand (&) indicates a logical AND, the bar (|) indicates a logical OR, and the tilde (~) indicates inversion of the identified signal. The heavy, dash-dot line in FIG. 5D corresponds to elimination of the possibility of a stuck condition when $\{x2, x1, x0, c\} = 0100$.

The edge counter of the present invention counts both positive and negative input signal edges with a 50/50 duty cycle output even when the divide ratio is odd. Only a 2 gate delay is incurred from input to output in the present invention, with a single gate path for symmetrical responses on positive and negative events. The present invention uses no flip-flop cells (the flip-flop functionality is merged into the common logic for speed), with a low total gate count and low power consumption.

The level mode sequential circuit implementation of the present invention results in low power consumption. In addition, the flip-flops causing additional latency delay and high power consumption in conventional edge counter designs are absent. The single input clock to output clock signal path, where the input clock is the only changing signal that causes the output clock to change state, has a two gate delay and results in symmetrical responses on positive and negative events (i.e., rising and falling input clock edges).

In the present invention, only one state variable corresponding to a physical signal node changes at any one instant. A 50/50 duty cycle output (assuming the input clock has a 50/50 duty cycle) is produced, and logic may be built in to eliminate states in which the edge counter may get stuck during power up. The present invention is a low power, low gate count (only 17 AND/OR gates in the exemplary embodiment) implementation.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. An edge counter comprising:
   an input receiving an input signal and an output on which an output signal is driven; and
   a set of logic gates between the input and output, the logic gates receiving the input signal and producing the output signal and configured to change a state of the edge counter with each transition of the input signal and to produce the output signal having a cycle corresponding to a predetermined number of transitions of the input signal;
   wherein the set of logic gates comprises no flip-flops.

2. The edge counter according to claim 1, wherein the predetermined number may be odd or even.

3. The edge counter according to claim 1, wherein a signal path between the input and output through the logic gates includes a sequence of only two logic gates.

4. The edge counter according to claim 1, wherein the logic gates generate a set of intermediate signals, at least one of the intermediate signals changing state in response to transition of the input signal.

5. A wireless receiver including the edge counter according to claim 1, the wireless receiver further comprising one of a local oscillator and a clock divider employing the edge counter.

6. A wireless communications system including the wireless receiver according to claim 5, the wireless communications system further a wireless transmitter and a communications path between the transmitter and the receiver.

7. A method of designing an edge counter comprising:
   defining a number of intermediate signals sufficient to count a predetermined number of edges;
   determining states of the intermediate signals to be generated; and
   from the determined states, deriving a set of logic gates receiving an input signal, generating the intermediate states in response to transitions in the input signal, and producing an output signal having a cycle corresponding to the predetermined number of edges within the input signal.

8. The method according to claim 7, further comprising:
   inserting gray codes for states of the intermediate signals in a table in a manner corresponding to changes based on input clock signal transitions.

9. The method according to claim 8, further comprising:
   inserting the gray codes in the table to correspond to a transition in the output signal.

10. The method according to claim 9, further comprising:
    identifying rows containing gray codes matching a row value.

11. The method according to claim 10, further comprising:
    generating a Karnaugh map for the states of the intermediate signals corresponding to the identified rows; and
    designing a set of logic gates to implement the logic function represented by the Karnaugh map.

12. The method according to claim 11, further comprising:
    generating a Karnaugh map for each of the intermediate signals and the output signal.

13. The method according to claim 7, further comprising:
    designing the logic gates to have a two gate delay between the input signal and the output signal.

14. An edge counter designed by the steps of:
    defining a number of intermediate signals sufficient to count a predetermined number of edges;
    determining states of the intermediate signals to be generated; and
    from the determined states, deriving a set of logic gates receiving an input signal, generating the intermediate states in response to transitions in the input signal, and producing an output signal having a cycle corresponding to the predetermined number of edges within the input signal.

15. The edge counter according to claim 14, further designed by the step of:
    inserting gray codes for states of the intermediate signals in a table in a manner corresponding to changes based on input clock signal transitions.

16. The edge counter according to claim 15, further designed by the step of:
    inserting the gray codes in the table to correspond to a transition in the output signal.

17. The edge counter according to claim 16, further designed by the step of:
    identifying rows containing gray codes matching a row value.

18. The edge counter according to claim 17, further designed by the steps of:
    generating a Karnaugh map for the states of the intermediate signals corresponding to the identified rows; and
    designing a set of logic gates to implement the logic function represented by the Karnaugh map.

19. The edge counter according to claim 18, further designed by the step of:
    generating a Karnaugh map for each of the intermediate signals and the output signal.

20. The edge counter according to claim 14, further designed by the step of:
    designing the logic gates to have a two gate delay between the input signal and the output signal.

21. An edge counter comprising:
    an input receiving an input signal and an output on which an output signal is driven; and
    a set of logic gates between the input and output, the logic gates receiving the input signal and producing the output signal and configured to change a state of the edge counter with each transition of the input signal and to produce the output signal having a cycle corresponding to a predetermined number of transitions of the input signal;
    wherein a signal path between the input and output through the logic gates includes a sequence of only two logic gates, and
    wherein the output signal has a 50/50 duty cycle even when the predetermined number is odd.

22. An edge counter comprising:
    an input receiving an input signal and an output on which an output signal is driven; and
    a set of logic gates between the input and output, the logic gates receiving the input signal and producing the output signal and configured to change a state of the edge counter with each transition of the input signal and to produce the output signal having a cycle corresponding to a predetermined number of transitions of the input signal;

wherein a signal path between the input and output through the logic gates includes a sequence of only two logic gates.

23. An edge counter comprising:

an input receiving an input signal and an output on which an output signal is driven; and a set of logic gates between the input and output, the logic gates configured to change a state of the edge counter with each transition of the input signal and to produce the output signal having a cycle corresponding to a predetermined number of transitions of the input signal, wherein a signal path between the input and output through the logic gates includes a sequence of only two logic gates, and wherein the sequence of only two logic gates comprises one AND gate and one OR gate.

* * * * *